United States Patent [19]
Sakudo et al.

[11] 4,316,090
[45] Feb. 16, 1982

[54] MICROWAVE PLASMA ION SOURCE

[75] Inventors: Noriyuki Sakudo, Ohme; Katsumi Tokiguchi, Hachioji; Hidemi Koike, Tokorozawa; Ichiro Kanomata, Fuchu, all of Japan

[73] Assignee: Hitachi, Ltd., Tokyo, Japan

[21] Appl. No.: 154,824

[22] Filed: May 30, 1980

[30] Foreign Application Priority Data

Jun. 4, 1979 [JP] Japan ................................ 54/68952

[51] Int. Cl.³ .......................................... H01J 27/00
[52] U.S. Cl. ............................... 250/423 R; 313/156; 313/363.1
[58] Field of Search ....................... 313/156, 362, 363; 250/423 R, 503, 505

[56] References Cited
U.S. PATENT DOCUMENTS

| | | | |
|---|---|---|---|
| 3,137,801 | 6/1964 | Brooks et al. | 250/423 |
| 3,552,124 | 1/1971 | Banks et al. | 313/362 |
| 4,058,748 | 11/1977 | Sakudo et al. | 313/156 |

Primary Examiner—Bruce C. Anderson
Attorney, Agent, or Firm—Craig and Antonelli

[57] ABSTRACT

A microwave plasma ion source according to this invention is characterized by the construction of the extracting electrode in contact with the discharge chamber. The electrode is divided into a part substantially exposed to a plasma and a remaining part which is not exposed to the plasma. Moreover, both these parts are held in a state in which they are electrically connected with each other.

As a result, very little P or As deposits on the surface of the electrode, and a stable high-current ion beam can be supplied over a long period of time.

8 Claims, 5 Drawing Figures

MICROWAVE PLASMA ION SOURCE

BACKGROUND OF THE INVENTION

1. Field of the Invention

This invention relates to an ion source, and more particularly to a microwave plasma ion source suitable for high current implanters.

2. Description of the Prior Art

Implanters can be broadly classified into the low current type (10 μA–below 1 mA) and the high current type (1 mA or above). This is because required impurity doses differ depending on the semiconductor devices to be manufactured, and the range is as wide as $10^{12}$–$10^{16}$ ions/cm$^2$. Since low current type implanters are easier to fabricate, most of the implanters presently in operation are of the low current type. Accordingly, the fields of application of the implanters have been limited to those where the doses are comparatively small (for example, the channels of MOS transistors and the bases of bipolar transistors). Recently, however, there has arisen a demand to form emitters of bipolar transistors and sources and drains of MOS transistors, where the doses are large, also by ion implantation. High current type implanters are required to meet this demand. In general, an implanter is constructed of an ion source, a mass separator, and a target chamber. Whether the implanter is of the high or the low current type depends upon the performance of the ion source used. At present, there are two sorts of apparatuses capable of implantation on the order of 1 mA. One is an apparatus employing a thermionic filament type ion source, in which low voltage arc discharge is caused by thermions from a filament parallel to an ion extracting slit, and ions are extracted in the form of a slit-shaped beam from the plasma produced by the discharge; the other is an apparatus employing a microwave plasma ion source, which will be described in detail below. The former has been presented, for example, in "The PR-30 Ion Implantation System" at the 14th Symposium on Electron, Ion and Photo Beam Technology, May 1977, while the latter is described in U.S. Pat. No. 4,058,748 issued Nov. 15, 1977. The ion sources of these two types will now be compared. The lifetime of the former is determined by the lifetime of the filament used, and is ordinarily several hours to ten or fifteen hours. In contrast, the latter has a very long lifetime because it does not include consumable parts, such as the cathode in the former. However, when PH$_3$ gas (for P+ ions), AsH$_3$ gas (for As+ ions) or the like is used as the gas to be ionized, the dissociated P or As gradually deposits on the surface parts of the electrodes, since the electrodes are in contact with the discharge chamber. The deposits close up the exit for the ion beam, becoming a cause of abnormal discharge within the discharge chamber. As a result, the ion beam becomes unstable after about 10–20 hours of operation, which is inconvenient.

BRIEF DESCRIPTION OF THE INVENTION

It is accordingly an object of this invention to provide a microwave plasma ion source suitable for implanters from which a stable high-current ion beam can be obtained for a long time.

In order to accomplish this object, this invention adopts the following construction: the electrode in contact with the discharge chamber is divided into two parts, a surface part substantially exposed to the plasma, and the remaining part mainly not exposed to the plasma, the two parts being held in electrical contact with each other. Owing to this construction, the temperature of the surface part exposed to the discharge chamber can be kept high so that the dissociation product of the discharge gas does not deposit on it.

This invention is based on the following principle. Consider an object divided into two parts A and B which are then put in contact in their original relative positions. Macroscopically, the two parts A and B seem as though they form the original single object. Microscopically, however, the two parts A and B are merely in contact at a large number of points. Therefore, when, for example, only part A is heated, the quantity of heat transmitted from part A to part B by heat conduction is very small. This is because part A and part B are merely in contact at a large number of points, so the heat resistance between them is much higher than that within the original single object. In consequence, the heat transfer from part A to part B is very limited, and the temperature of part A can be kept high.

In this invention, the surface part of the electrode in contact with the discharge chamber is thermally insulated from the other part by dividing the electrode, while still maintaining its function as the electrode because it is in electrical contact with the other part. With this characterizing construction of this invention, the surface part of the electrode in contact with the discharge chamber can be kept at a high temperature during operation, so that even when PH$_3$ gas or AsH$_3$ gas is used as the gas to be ionized, only negligible amounts of P or As deposit on the surface part of the electrode. As a result, it is possible to obtain a stable high-current ion beam over a long period of time. An implanter using this type of microwave plasma ion source is continuing to supply a stable high-current ion beam at the present time after more than 200 hours of operation.

DETAILED DESCRIPTION

Now, this invention will be described in detail with reference to the drawings.

Figure 1:
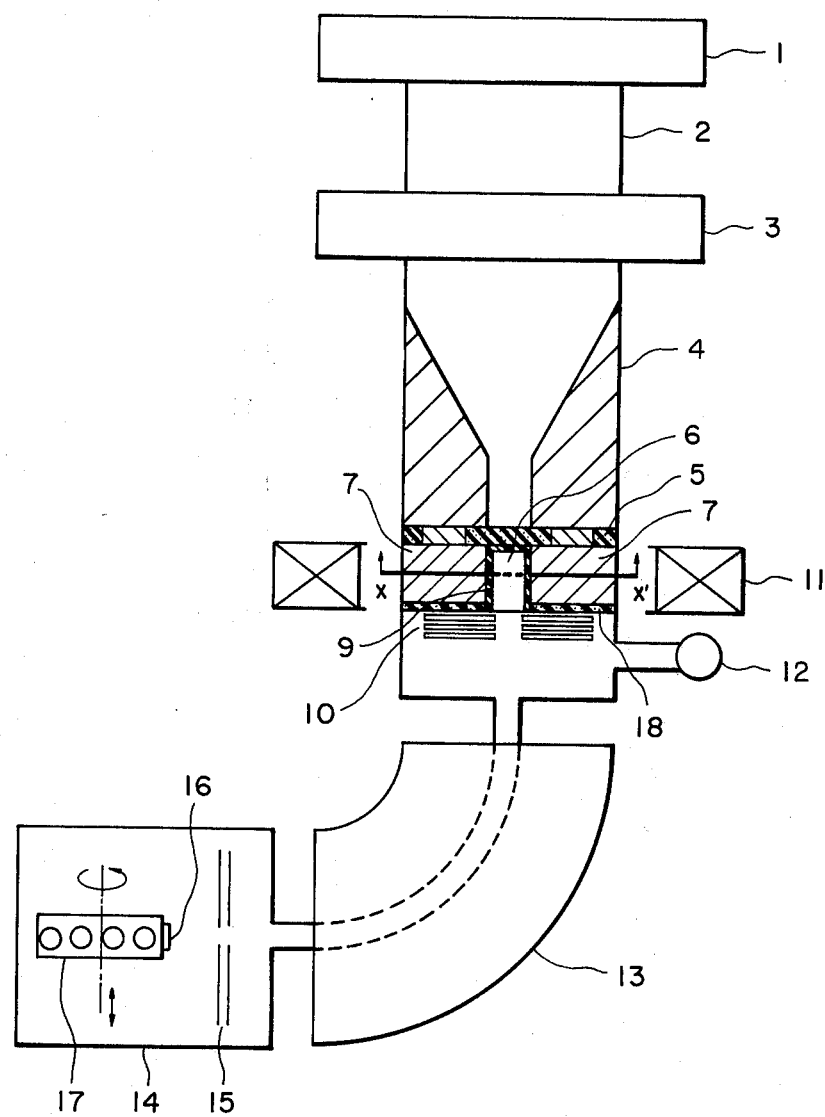
FIG. 1 is a schematic diagram of an implanter using a microwave plasma ion source.
Figure 2:
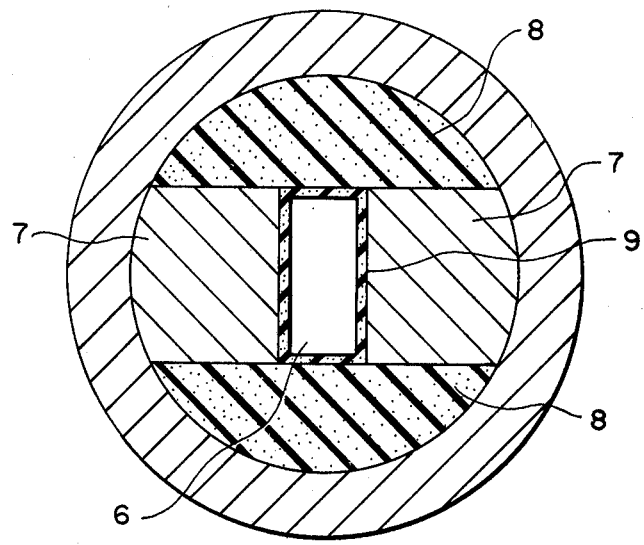
FIG. 2 is a sectional view of the ion source in FIG. 1 as taken along X—X' in FIG. 1.

FIG. 1 shows a schematic explanatory view of a high current implanter which employs as its ion source a microwave plasma ion source. Microwaves generated by microwave generator (magnetron at 2.45 GHz and 600 W) 1 are propagated to ridge waveguide 4 via rectangular waveguide 2, and are propagated therefrom to discharge chamber 6 via vacuum sealing dielectric (aluminous porcelain) 5. A microwave electric field is established between ridge electrodes 7 and 7 forming discharge member 6. Those surfaces of ridge electrodes 7 and 7 facing the discharge chamber 6 are arranged substantially in parallel. As seen from the enlarged sectional view along X—X' in FIG. 1 illustrated in FIG. 2, the parts other than the space defined by the opposing ridge electrodes 7 and 7 are filled with dielectrics (boron nitride) at 8 and 8 in order to confine a region for generating plasma. That is, among the two pairs of walls of the discharge chamber 6 parallel to the direction of ion extraction, one pair of walls are formed by the ridge electrodes 7 and 7, and the other pair of walls are formed by the dielectrics 8 and 8. Further, the discharge chamber 6 is surrounded with a dielectric box 9 (made of boron nitride) in order to prevent the metal element forming the ridge electrodes 7 and 7 from mixing into the chamber and to insulate the chamber thermally from its surroundings. As can be seen from FIG. 2, the discharge chamber 6 is formed so that the periphery of the section perpendicular to the direction of the ion beam extraction is shaped into an elongated rectangle, and the dimensions (5 mm × 44 mm) of the rectangle are somewhat larger than the dimensions (2 mm × 40 mm) of ion extracting electrode system 10.

$PH_3$ gas is introduced through a gas introduction port (not shown) into the discharge chamber 6 (the pressure in the discharge chamber 6 after introduction is about $8 \times 10^{-6}$ Torr), and a magnetic field of about 1,000 Gauss which acts on the microwave electric field is generated by magnetic field generating coil 11. Then the plasma is generated within the discharge chamber 6. Ions are extracted by the ion extracting electrode system 10 from the plasma generated in the discharge chamber 6. The discharge chamber 6 is kept at a predetermined pressure ($1 \times 10^{-6}$ Torr) by vacuum system 12. In addition, choke flange 3 is used to give direct current insulation between the microwave generator 1 and the ion source.

Figure 4:
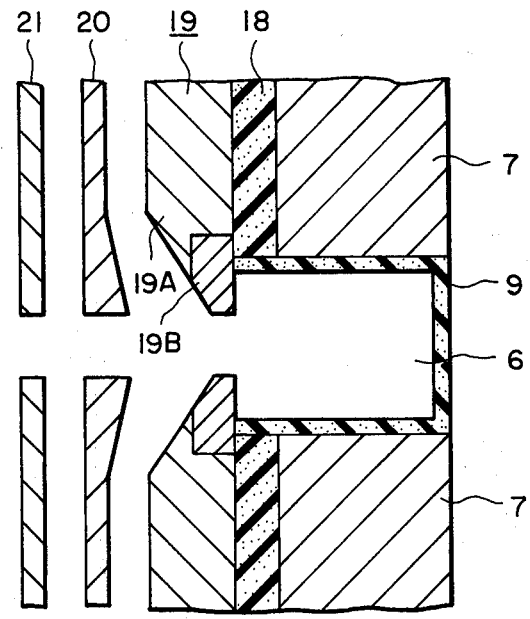
FIG. 4 is a sectional view of the essential portions of an ion source according to this invention.
Figure 5:
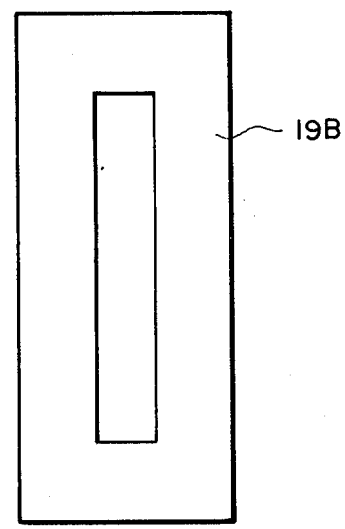
FIG. 5 is a front view of a part 19B in FIG. 4.

The ion beam, including $P^+$, $P_2^+$, $P^{++}$, $PH^+$, etc. as extracted by the ion extracting electrode system 10 is subjected to mass separation by mass separator (deflection angle of 60°, radius of 40 cm, and magnetic field of 9,500 Gauss) 13, and only the $P^+$ ions are introduced into ion target chamber 14. The $P^+$ ion beam (at an implantation current of 3 mA) introduced into the target chamber 14 irradiates semiconductor wafers (each 3 inches in diameter) 16 through slit system 15. There are twenty-four wafers 16 mounted on the outer surface of drum (40 cm in radius) 17. The drum 17 is rotated at a fixed speed (15 r.p.m.) in a direction orthogonal to the irradiation direction of the ion beam, and is also moved back and forth in the direction of its own axis of the drum 17. This serves to avoid overheating the wafers by the high-current ion beam. FIG. 4 shows an expanded sectional view of part of the discharge chamber 6 and the extracting electrode system 10 in FIG. 1 as constructed according to this invention. As already explained with reference to FIG. 1, the discharge chamber 6 is isolated from the ridge electrodes 7 and 7, and other parts in the surroundings by means of the dielectric box 9 (made of boron nitride). The ion extracting electrode system 10 in FIG. 1 comprises positive electrode (+50 KV) 19, negative electrode (−2 KV) 20 and grounded electrode (0 V) 21. The ridge electrodes 7, 7 and the positive electrode 19 are insulated by dielectric (boron nitride) 18. In the ion extracting electrode system 10, the positive electrode 19 lying in contact with the discharge chamber 6 is composed of part 19A and part 19B (the front view of which is shown in FIG. 5). The reason for this is as follows. There is an ion sheath extending between the plasma generated in the discharge chamber 6 and the inner wall surface of the discharge box 9 defining the discharge chamber 6 and between the plasma and the inner wall surface of part 19B of the electrode 19 which lies on the side of the discharge chamber 6, so that the plasma has a floating potential (usually several volts to several tens of volts) with respect to those surfaces. Accordingly, ions having energy equivalent to the floating potential are always colliding against those surfaces and heating them with the thermal energy of the ions. Since, however, the positive electrode 19 is divided into two parts 19A and 19B, only the temperature of the part 19B rises, and the temperature rise of part 19A is very slight, as already stated. The same applies between the dielectric box 9 and the ridge electrodes 7, 7, and the other surrounding parts. That is, all the wall surfaces encircling the plasma are thermally insulated from the surroundings. As a result, the wall surfaces around the plasma stay very hot, so that even when $PH_3$ gas or $AsH_3$ gas is used as the gas to be ionized, P or As cannot deposit on the wall surface of the part 19B. An experiment was conducted using stainless steel as the electrode material for both parts 19A and 19B. There was very little deposition, but some distortion. This is considered to be thermal distortion.

Subsequently, carbon was used as the material for the part 19B. This led to almost no distortion, and good results were obtained.

Figure 3:
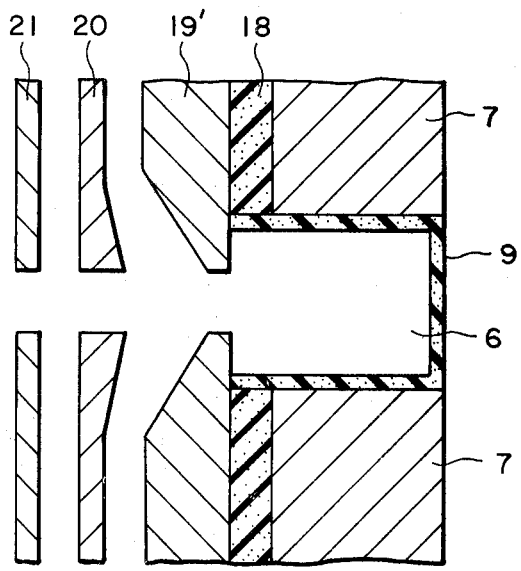
FIG. 3 is a sectional view of the essential portions of the prior-art ion source.

The part 19B in this embodiment was 50 mm × 10 mm in area and 2 mm thick. On the other hand, in the prior-art construction illustrated in FIG. 3, electrode (made of stainless steel) 19' had a unitary structure. As already stated, the unitary structure results in very high heat conduction. Accordingly, the temperature of the wall surfaces facing the plasma did not rise, resulting in deposition of P or As. In consequence, the lifetime of the ion source was substantially shortened.

In FIG. 4, the parts 19A and 19B, which constitute positive electrode 19, are in contact, resulting in electrical connection. Accordingly, the most desirable assembly structure is one in which the part 19B is held between the dielectric 18 as well as the dielectric box 9 and the part 19A.

In the foregoing embodiment, the electrical connection between the parts 19A and 19B is effected by mutual contact. However, other means of electrical connection may be adopted. In summary, this invention achieves thermal insulation by dividing the electrode and putting the two pieces in contact with each other.

Further, the method of division need not be restricted to that in the foregoing embodiment, but any other method of division may be used.

Still further, this invention is not restricted to microwave plasma ion sources, but is applicable to all other ion sources in which an electrode for deriving ions from plasma faces the plasma.

As set forth above, ion sources according to this invention can produce a stable high-current ion beam over a long period of time, so the industrial value of the invention is very great.

We claim:

1. In a microwave plasma ion source having a discharge chamber, means to produce a microwave discharge plasma within said discharge chamber, and an ion extracting electrode system to extract ions from the microwave discharge plasma in said discharge chamber;

said ion extracting electrode system comprising an extractor electrode which lies in contact with said discharge chamber and which has an aperture through which ions are extracted from said discharge chamber, said extractor electrode being divided into a first part which is substantially exposed to the plasma in said discharge chamber and a remaining second part which is mainly not exposed to the plasma, both said first and second parts being individual elements of electrically-conductive material in electrical contact with each other.

2. A microwave plasma ion source as defined in claim 1, wherein both said first and second parts which constitute said electrode are made of an identical electrode material.

3. A microwave plasma ion source as defined in claim 2, wherein the electrode material which forms both said first and second parts is stainless steel.

4. A microwave plasma ion source as defined in claim 1, wherein both said first and second parts which constitute said electrode are made of different electrode materials.

5. A microwave plasma ion source as defined in claim 4, wherein the material which forms said first part exposed to the plasma is carbon, while the material which forms said second part not exposed to the plasma is stainless steel.

6. A microwave plasma ion source as defined in claim 1, wherein a portion of said first part forms a section of the wall of said discharge chamber in which said aperture is located.

7. A microwave plasma ion source as defined in claim 1, wherein the size of said first part is substantially greater than said second part.

8. A microwave plasma ion source as defined in claim 1, wherein said second part of said electrode is made of a non-magnetic, electrically-conductive material.

* * * * *